United States Patent
Choi et al.

(10) Patent No.: US 11,980,057 B2
(45) Date of Patent: May 7, 2024

(54) EMISSIVE DISPLAY CONFIGURED FOR THROUGH-DISPLAY IMAGING

(71) Applicant: GOOGLE LLC, Mountain View, CA (US)

(72) Inventors: Sangmoo Choi, Palo Alto, CA (US); Jyothi Karri, San Jose, CA (US); Ion Bita, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 103 days.

(21) Appl. No.: 17/595,198

(22) PCT Filed: May 22, 2020

(86) PCT No.: PCT/US2020/070071
§ 371 (c)(1),
(2) Date: Nov. 11, 2021

(87) PCT Pub. No.: WO2020/243740
PCT Pub. Date: Dec. 3, 2020

(65) Prior Publication Data
US 2022/0181397 A1  Jun. 9, 2022

Related U.S. Application Data

(60) Provisional application No. 62/853,044, filed on May 26, 2019.

(51) Int. Cl.
*H10K 59/121* (2023.01)
*G06F 3/044* (2006.01)
(Continued)

(52) U.S. Cl.
CPC ......... *H10K 59/121* (2023.02); *G06F 3/0446* (2019.05); *H10K 59/126* (2023.02);
(Continued)

(58) Field of Classification Search
CPC .. H10K 59/121; H10K 59/126; H10K 59/131; H10K 59/40; H10K 59/65;
(Continued)

(56) References Cited

U.S. PATENT DOCUMENTS

| 7,999,889 B2 | 8/2011 | Minoura et al. |
| 10,334,739 B1 * | 6/2019 | Honan ................ C23C 18/1608 |

(Continued)

FOREIGN PATENT DOCUMENTS

| CN | 106814498 A * | 6/2017 | ....... G02F 1/133553 |
| CN | 108269840 A | 7/2018 | |

(Continued)

OTHER PUBLICATIONS

Xu et al., Machine Translation of Foreign Patent Document CN 106814498 A, Display Device And Manufacturing Method Thereof Jun. 9, 2017, pp. 1-23 (Year: 2017).*

(Continued)

*Primary Examiner* — Amr A Awad
*Assistant Examiner* — Maheen I Javed
(74) *Attorney, Agent, or Firm* — Fish & Richardson P.C.

(57) ABSTRACT

A display configuration to facilitate imaging through the display is disclosed. The imaging can be achieved by positioning a camera behind a through-transmissive area of a display. The through-transmissive area is configured to reduce the interaction between the light propagating through the display and circuit elements of the display. The configuration of the through-transmissive area can be characterized by reduced pixel density, rearranged circuit elements, and a light blocking layer to prevent light from diffracting from gaps formed by circuit elements.

12 Claims, 17 Drawing Sheets

(51) Int. Cl.
*H10K 59/12* (2023.01)
*H10K 59/126* (2023.01)
*H10K 59/131* (2023.01)
*H10K 59/40* (2023.01)
*H10K 59/65* (2023.01)
*H10K 71/00* (2023.01)

(52) U.S. Cl.
CPC ........... *H10K 59/131* (2023.02); *H10K 59/40* (2023.02); *H10K 59/65* (2023.02); *H10K 71/00* (2023.02); *H10K 59/1201* (2023.02)

(58) Field of Classification Search
CPC .... H10K 71/00; H10K 59/1201; H10K 50/86; H10K 50/865; H10K 59/12; H10K 59/50; H10K 59/60; G06F 3/0446; H04M 1/0266
See application file for complete search history.

(56) References Cited

U.S. PATENT DOCUMENTS

| | | | |
|---|---|---|---|
| 2011/0102308 A1 | 5/2011 | Nakamura et al. | |
| 2013/0127739 A1 | 5/2013 | Guard et al. | |
| 2015/0331508 A1* | 11/2015 | Nho | G06F 3/042 345/173 |
| 2018/0182816 A1 | 6/2018 | Kang et al. | |
| 2019/0156097 A1 | 5/2019 | Liu et al. | |
| 2020/0075680 A1 | 3/2020 | Sun et al. | |
| 2021/0366990 A1* | 11/2021 | Tang | H10K 65/00 |

FOREIGN PATENT DOCUMENTS

| | | | | |
|---|---|---|---|---|
| CN | 109192759 A | | 1/2019 | |
| CN | 110660835 A | * | 1/2020 | ......... H01L 27/3234 |
| WO | 2019199693 A1 | | 10/2019 | |

OTHER PUBLICATIONS

Cao et al., Machine Translation of Foreign Patent Document CN 110660835 A , Organic light-emitting display panel and organic light-emitting display device, Jan. 7, 2020, pp. 1-10 (Year: 2020).*
International Preliminary Report on Patentability in International Appln. No. PCT/US2020/070071, mailed Dec. 9, 2021, 11 pages.
Office Action in Chinese Appln. No. 202080027056.X, mailed on Aug. 25, 2023, 16 pages (with English translation).
International Search Report and Written Opinion for PCT Application No. PCT/US2020/070071, mailed on Aug. 20, 2020, 13 pages.

* cited by examiner

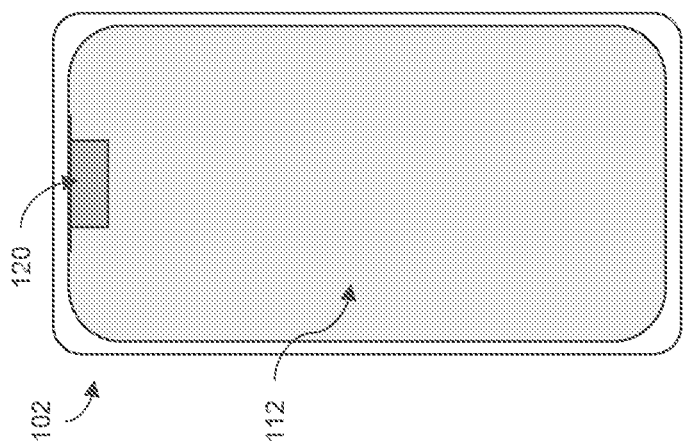
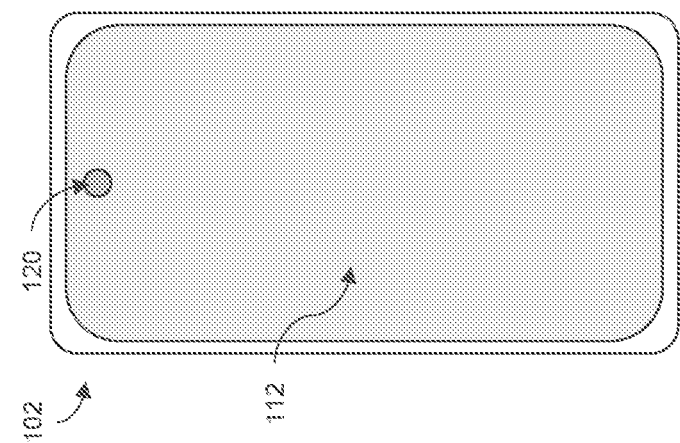
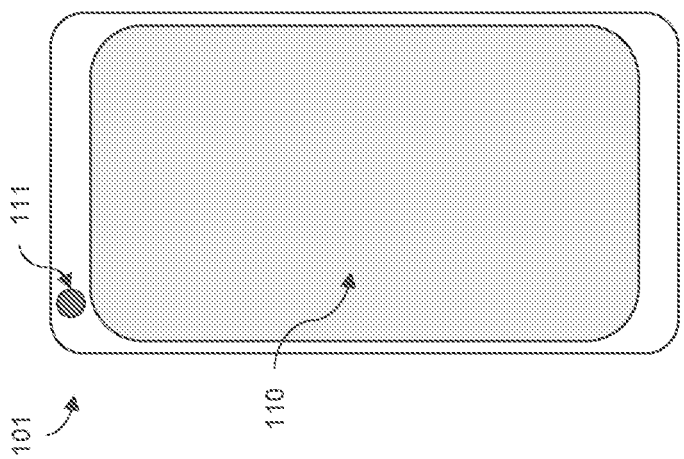
FIG. 1A
FIG. 1B
FIG. 1C

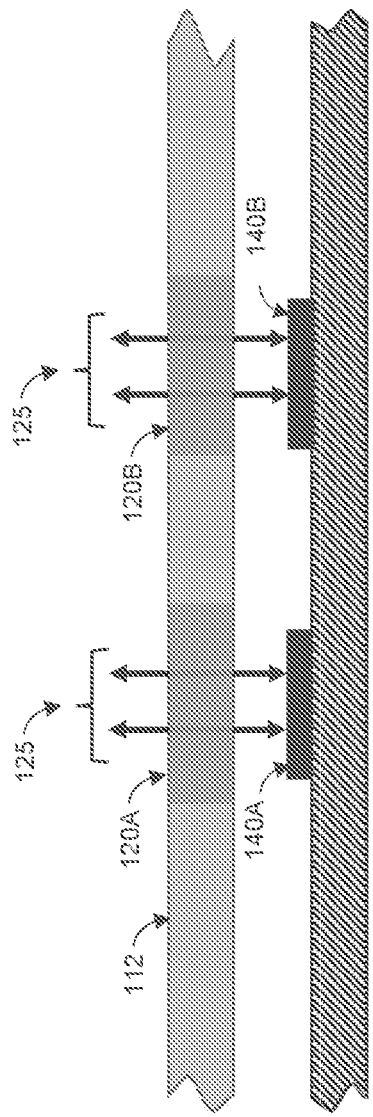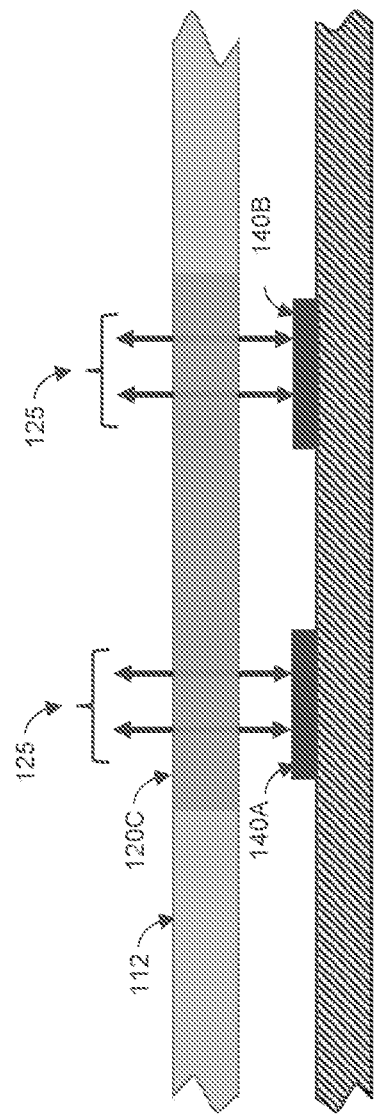

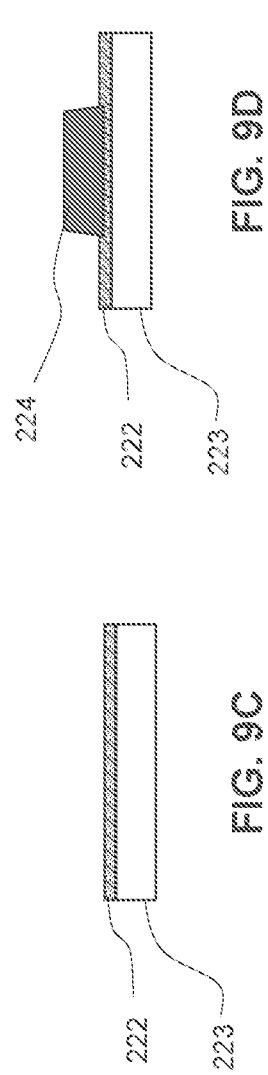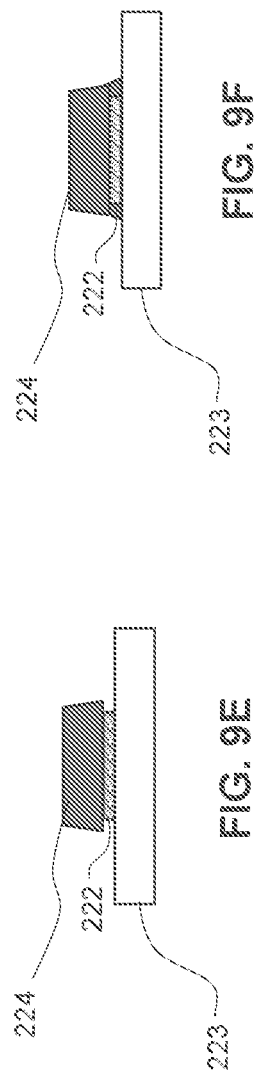

EMISSIVE DISPLAY CONFIGURED FOR THROUGH-DISPLAY IMAGING

CROSS-REFERENCE TO RELATED APPLICATIONS

This application is a 35 U.S.C. § 371 National Phase Entry Application from PCT/US2020/070071, filed May 22, 2020, designating the U.S., which claims priority to, U.S. Provisional Patent Application No. 62/853,044, filed on May 26, 2019, the disclosures of each of which is incorporated by reference herein in its entirety.

FIELD OF THE DISCLOSURE

The present disclosure relates to flat panel displays and more specifically to a display for a mobile device that enables imaging through the display.

BACKGROUND

Expanding a display to cover more area of a mobile device (e.g., mobile phone, tablet, etc.) may be desirable from, at least, a user experience standpoint. However, electro-optical devices positioned on a side of the mobile device that also includes the display (e.g., a front-facing camera, a light sensor, an emissive status light, etc.) may compete for real estate on the side of the device that includes the display. Thus, the size of the emissive area of the display may have to be compromised to accommodate the electro-optical devices on the display side of the device.

SUMMARY

In one general aspect, the present disclosure describes a mobile device that includes a display and a light sensor (e.g., a camera) positioned behind the display. The display includes a high-resolution area and a through-transmissive area (i.e., region). The through-transmissive area includes pixels that are spaced according to a first pixel density that is lower than a second pixel density of the high-resolution area. The display also includes circuit elements that control the pixels in the sensing-though area. The display also includes a light-blocking layer having an opaque pattern that is aligned with the circuit elements to block light before or after propagating through gaps formed by the circuit elements. The light sensor is positioned behind the through-transmissive area and receives light through the display that is not blocked by the light-blocking layer. The light-blocking layer may be referred to as an opaque layer.

In another general aspect, the disclosure describes a method for imaging through a display. The method includes positioning a camera behind an area of a display to receive light directed to the area. The method further includes eliminating a portion of pixels in the area so that the pixels in the area are spaced further apart than outside the area. Next, circuit elements in the area are arranged to create openings in the area so that a first portion of the light directed to the area can pass through without encountering any of the circuit elements. Next, a second portion of the light directed to the area is blocked using a wider opaque layer before or after the second portion of light is diffracted by gaps formed by the circuit elements. Finally, using the camera, the first portion of the light is captured to create an image.

In some implementations, the opaque layer covering the circuit elements is a metal electrode for a touch sensor layer of the display. The metal electrode is created to have a pattern that aligns with a pattern for the circuit elements and covers the circuit elements to prevent light from reaching the circuit elements. In some cases, the electrode pattern includes apertures for the display pixels in the area to emit through (e.g., during times other than during a time capturing an image).

In another general aspect, the present disclosure describes an active matrix organic light emitting diode (AMOLED) display that includes a through-transmissive region of an active pixel area. The through-transmissive region includes a pixel density that is lower than other regions of the active pixel. The through-transmissive region also includes circuit elements (e.g., TFTs, capacitors, power lines, control signal lines, and pixels) that define gaps capable of diffracting light passing through the through-transmissive region. The AMOLED display also includes a light-blocking layer having a metal pattern that is positioned above and aligned with the gaps to prevent light from being diffracted as it passes through the through-transmissive region. In some implementations the metal pattern includes apertures for the display pixels to shine through.

In another general aspect, the disclosure describes a mobile computing device comprising a display having a high-resolution area and a through-transmissive area. The through-transmissive area includes pixels that are spaced in a repeating pattern according to a first pixel density that is lower than a second pixel density of the high-resolution area. The through-transmissive area further includes circuit elements configured to control the pixels, and a light-blocking layer having an opaque pattern that is aligned with the circuit elements to block light before or after propagating through gaps formed by the circuit elements. The mobile computing device further comprises a light device positioned behind the through-transmissive area, such that the circuit elements and the light-blocking layer are between a surface of the display and the light device, wherein the light device is configured to receive or transmit light through the display that is not blocked by the light-blocking layer.

Where the light device is a sensor, the sensor may be configured to receive light through the display that is not blocked by the light-blocking layer. Where the light device is a light source, the light source may be configured to transmit light through the display that is not blocked by the light-blocking layer.

The display may include an active matrix organic light emitting diode (AMOLED) display.

The circuit elements may include signal lines. In a repeating pattern of pixels in the through-transmissive area, in a group of three or more parallel signal lines between adjacent pixels, adjacent signal lines may be spaced apart from each other by less than 7 microns.

The circuit elements may include signal lines. In a repeating pattern of pixels in the through-transmissive area, in a group of three or more parallel signal lines between adjacent pixels, adjacent signal lines may be spaced apart from each other by less than 5 microns.

The circuit elements may include signal lines. The repeating pattern of pixels may be characterized by a unit cell having a first area. The unit cell may include a second area that is free of subpixels and free of signal lines and that is greater than 40% of the first area.

The light-blocking layer may be positioned between the surface of the display and a layer containing the circuit elements. The light-blocking layer may be positioned above a layer containing the circuit elements.

The light-blocking layer may include a touch sensor layer.

The opaque pattern may include electrodes in the touch sensor layer. The opaque pattern may include opaque portions.

The opaque pattern may include metal electrodes in the touch sensor layer.

The touch sensor electrodes may be covered by a layer having an optical absorption of greater than 90%.

The opaque pattern may include apertures to allow light emitted from pixels in the display to shine through. The apertures may be referred to as transparent portions.

The opaque pattern may absorb visible and infrared light.

The opaque pattern may reflect visible and infrared light.

The light device may comprise a light sensor.

The light sensor may include a camera.

The through-transmissive region may have a pixel density that is lower than other regions of the active pixel area and may include circuit elements arranged such that they diffract visible light that passes through the through-transmissive region.

The light-blocking layer may include a pattern of opaque portions and transparent portions. The opaque portions may be positioned above, and aligned with, the circuit elements to prevent light transmitted through the through-transmissive region from reaching the circuit elements.

At least some of the transparent portions of the pattern may be aligned with pixels in the through-transmissive region to allow light from the pixels to shine through the light-blocking layer and through the through-transmissive region and out of the display.

The opaque portions of the pattern may include touch sensor electrodes of the AMOLED display.

The light-blocking layer may include a pattern of opaque portions and transparent portions. The opaque portions may be positioned below, and aligned with, the circuit elements to prevent light transmitted through the through transmissive region and diffracted by the circuit elements from reaching the light device.

The circuit elements in the through-transmissive region may include signal lines configured to provide electrical signals to pixels in the display.

A width of the signal lines may be greater than 500 nm.

Two or more of the signal lines may be are parallel to each other, with a gap between the parallel signal lines being less than one micron.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 1A depicts a top (front) surface of a mobile computing device including a display and an optical device that occupy different portions of the front surface.

FIG. 1B depicts a top (front) surface of a mobile computing device including a display with an optical device positioned behind a through-transmissive area of the display according to a possible implementation of the disclosure.

FIG. 1C depicts a top (front) surface of a mobile computing device including a display with an optical device position behind a through-transmissive area of the display according to a possible implementation of the disclosure.

FIG. 2A depicts a side, cross-sectional view of a mobile device that may include a plurality of optical devices, each positioned behind a respective through-transmissive area of an emissive display according to a possible implementation of the disclosure.

FIG. 2B depicts a side, cross-sectional view of a mobile device that may include a plurality of optical devices positioned behind a single through-transmissive area of an emissive display according to a possible implementation of the disclosure.

FIG. 7B depicts a possible rearrangement of signal lines of the reduced-resolution portion of an emissive display to produce clear apertures for light to pass through.

FIG. 8 is a top (front) view of an opaque pattern for preventing light from reaching the rearranged signal lines of FIG. 7B while allowing light from pixels of the emissive display to transmit through.

FIGS. 9C, 9D, 9E, and 9F depict side, cross-sectional views of a metal touch sensor electrode in various stages of being covered by an opaque, low-reflectivity material.

The components in the drawings are not necessarily drawn to scale and may not be in scale relative to each other. Like reference numerals designate corresponding parts throughout the several views.

DETAILED DESCRIPTION

Figure 2C:
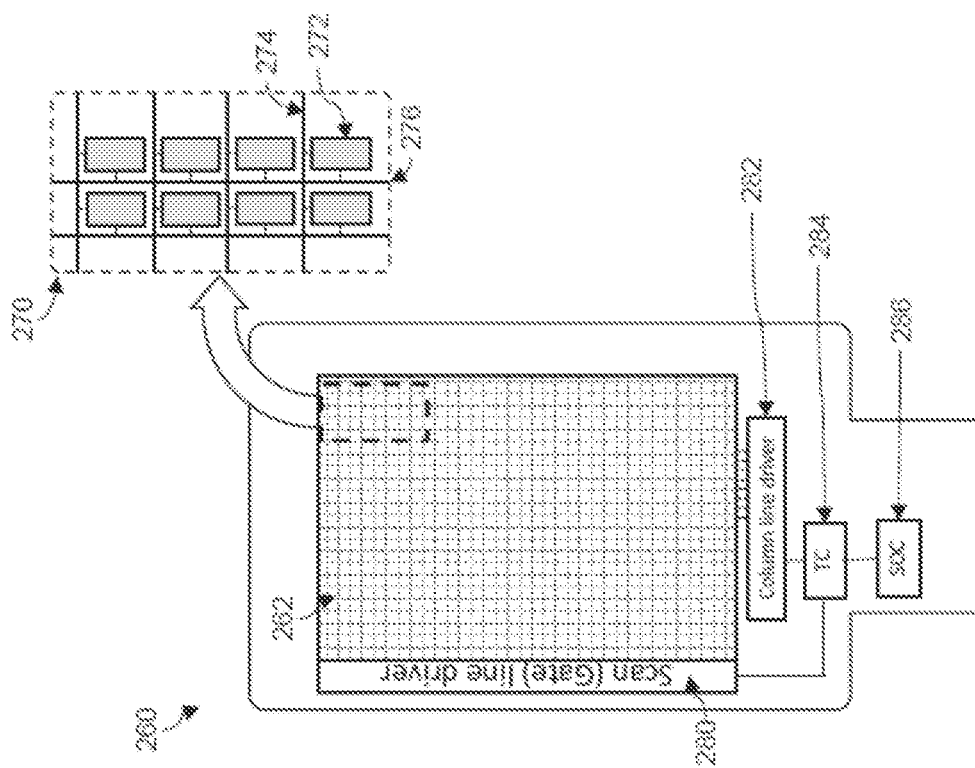
FIG. 2C is a schematic diagram of a display system that includes a display panel having emissive pixels that include subpixels that are controlled by electronic pixel circuits and/or subpixel circuits to render a visual output.

The present disclosure describes a flat panel display (i.e., display) that can be used with a mobile device (e.g., mobile phone, tablet, etc.). The front surface of a mobile device includes a display typically operating as a graphic user interface (GUI) and one or more optical devices operating as sensors or emitters. The one or more optical devices can be configured for a variety of functions, including sensing lighting conditions (e.g. a light sensor), sensing proximity (e.g., an electromagnetic sensor), capturing images (e.g., a front-facing camera), and/or to providing light (e.g., flash). An optical device can be located under a portion of the display, such that display area need not be sacrificed to accommodate the optical device on the front surface of the mobile device. Circuitry and optical masks within the mobile device can be arranged, such that diffraction of light passing through the display to or from the optical device is reduced compared to conventional configurations of mobile devices.

Traditionally, the emissive portion of the display and the optical devices have occupied separate areas of the front surface of the mobile device. For example, FIG. 1A depicts a mobile device 101 having a display 110 and a camera 111 that occupy different portions of the front surface. Recent advances in emissive display technology (e.g., active matrix organic light emitting diode (AMOLED)) facilitate extending the emissive (i.e., active) area of the display towards the edges of the mobile device. By extending the active area of the display towards the edges of the mobile device, a user may experience the benefits of a larger display without the drawbacks of a larger form factor device.

The disclosed emissive display is configured to share the front surface of a mobile device with one or more optical devices so that the active area of the display can be extended to the edges, without the need for leaving gaps in the display of a bezel around the display in which to locate the optical devices. Accordingly, one or more portions of the disclosed display covering the one or more optical devices can be configured so that the optical devices, positioned behind the display, can transmit or receive radiation (e.g., light) through the display.

FIG. 1B illustrates a mobile device 102 with a display 112 extended towards the edges of the device. Unlike mobile devices in which the display is excluded from an area reserved for optical devices, the light-emitting (i.e., active) area of the display 112 extends over substantially the entire front surface of the device 102. Accordingly, nearly the entire front surface of the mobile device 102 may be used to present color, black-and-white, or gray-scale images, graphics, and/or characters. The display 112 includes one or more through-transmissive areas 120 behind which (i.e., below which) an optical device (or optical devices) may be disposed and through which light can be transmitted to be received by the optical device and/or through which light can be transmitted from the optical device and out of the display 112.

The size, shape, and/or position of the through-transmissive area 120 may be implemented variously. For example, as shown in FIG. 1B, the through-transmissive area 120 can have a rounded (e.g., circular) shape and can be positioned within a perimeter of the display 112 and spaced apart from edges of the display 112, but other shapes and locations of the through-transmissive area 120 are possible. For example, as shown in FIG. 1C, a through-transmissive area 120 can have rectangular in shape and can be positioned along an edge of the display 112. In this implementation, the horizontal and vertical edges of the through-transmissive area 120 can correspond to the horizontal and vertical directions of a grid arrangement of light-emitting pixels in the display 112 and to the horizontal and vertical directions of electrical signal lines signal lines that deliver electrical signals to the pixels. Additionally, the size of the through-transmissive region 120 in FIG. 1C can be different than that size of the through-transmissive area in FIG. 1B.

FIG. 2A depicts a side, cross-sectional view of a mobile device having a display 112 with multiple through-transmissive regions 120A, 120B though which electromagnetic radiation can be transmitted to or from an optical device located under the display, for example, a camera located under the display. The mobile device can include multiple optical devices 140A, 140B, each positioned behind different through-transmissive areas 120A, 120B. FIG. 2B depicts a side, cross-sectional view of a mobile device having a display 112 with a single region 120C for use by the multiple optical devices 140A, 140B.

The optical devices 140A, 140B may transmit and/or receive electromagnetic radiation 125 through the through-transmissive regions 120A, 120B, 120C. While the disclosure may be generally applied to any optical device configured to transmit or receive electromagnetic radiation (e.g., from the millimeter wave, visible, or infrared portions of the electromagnetic spectrum), the particular implementation of a camera configured to receive visible light and/or infrared light will be considered throughout the disclosure.

In some implementations, pixels in the through-transmissive areas 120A, 120B, 120C of the display 112 through which light passes to an underlying sensor may have the same pixel density and/or pixel arrangement as in the rest of the display. In some implementations, the through-transmissive areas 120A, 120B, 120C (i.e., portion) of the display 112 through which light passes to an underlying sensor may have a different pixel density and/or pixel arrangement than the rest of the display. For example, in some implementations, the display region of the rest of the display may have a pixel density that is higher than the pixel density in the through-transmissive areas 120A, 120B, 120C, such that the resolution of the display (e.g., as measured in pixels per inch (ppi)) is lower in the through-transmissive areas 120A, 120B, 120C than in the rest of the display.

FIG. 2C schematically depicts a possible display system 260 that can be used with a mobile device 102 of FIG. 1B or FIG. 1C. The display system 260 includes a display panel 262 having emissive pixels that include subpixels that are controlled by electronic pixel circuits and/or subpixel circuits to render a visual output (e.g., text, graphics, video, images, etc.) on the display. A subpixel can be considered as an individual light emitting element, generally having a monochromatic light output, whereas a pixel can be considered as a combination of two or more light emitting elements, where the different light emitting elements have different colors, so the pixel can be controlled to output a range of colors. The display may be any active matrix display, such as an active matrix organic light emitting diode (AMOLED) display.

A magnified portion 270 of the display panel 262 is shown. The magnified portion 270 illustrates the row/column configuration of subpixels 272. The light emission of each subpixel 272 can be controlled by a scan (gate) signal line 274 (i.e., a horizontal control line) and by a column data line 276 (i.e., a vertical control line). In some implementations, and as illustrated in FIG. 2, all subpixels in a row share can be driven by the same gate signal line, and all subpixels in a column can be driven by the same column data line.

The scan signal lines 274 of the display panel 262 are controlled by gate drivers 280. The column data lines are controlled by column line drivers 282. Each column data line 276 may have a panel switch in series for switching (e.g., demultiplexing) data voltages from the column line driver 282 (e.g., to control the intensity of a pixel). A timing controller 284 can control signals to the scan line drivers 280 and to the column line drivers 282 to ensure proper timing of signals to individual subpixels to achieve a desired light emission from the subpixels. The timing controller 284 can receive control signals from a system-on-a-chip 286 that includes, for example, a central processing unit (CPU).

Figure 3B:
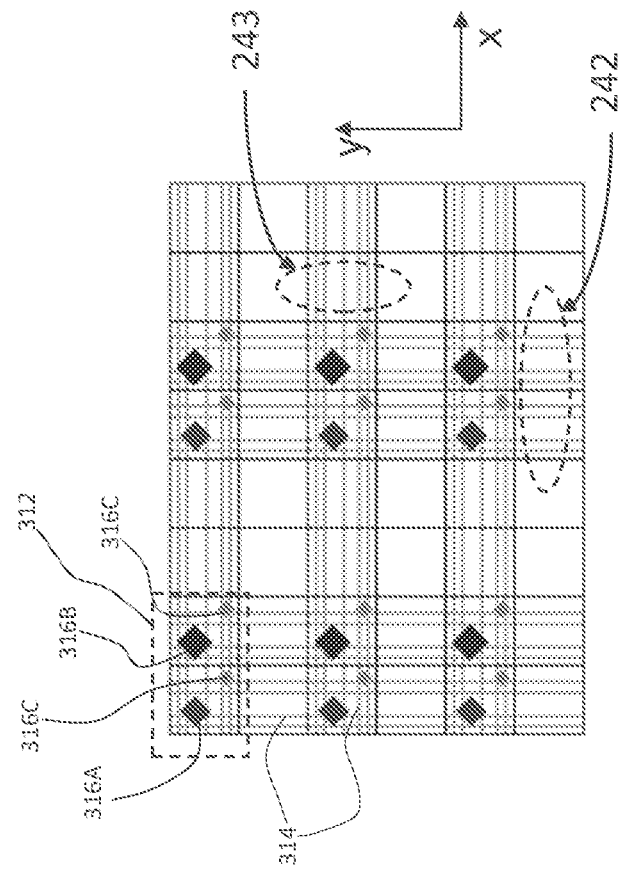
FIG. 3B depicts a top (front) view of pixels and signal lines of a reduced-resolution portion of an emissive display according to a possible implementation of the disclosure.
Figure 3A:
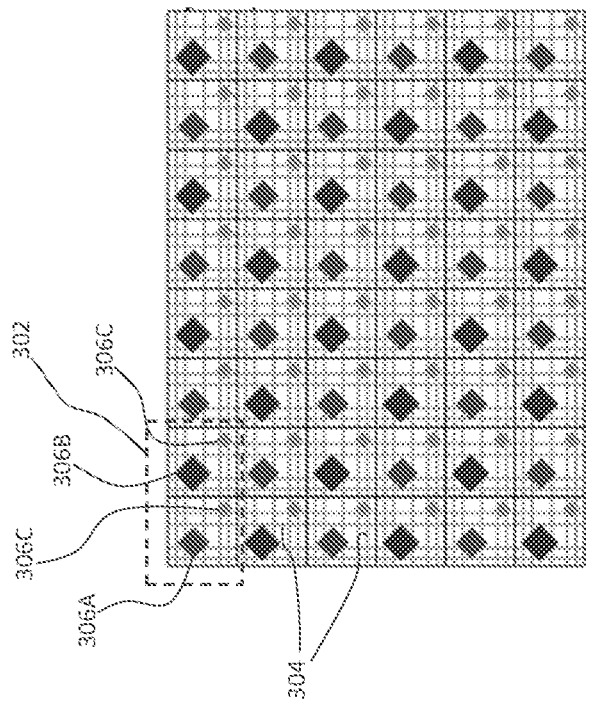
FIG. 3A depicts a top (front) view of pixels and signal lines of a high-resolution portion of an emissive display according to a possible implementation of the disclosure.

FIG. 3A is a schematic diagram of a high-resolution portion of an emissive display having pixels 302 that include multiple light emitting elements and signal lines that supply electrical signals to the light emitting elements. FIG. 3B is a schematic diagram of a reduced-resolution portion of the emissive display having pixels 312 that include multiple light emitting elements and signal lines 242 that supply electrical signals to the light emitting elements. In FIG. 3A and in FIG. 3B, pixels 302, 312 in the display can include a plurality of light emitting elements (e.g., light emitting diodes) 306A, 306B, 306C, 316A, 316B, 316C that emit different colors, so that all visible colors can be produced by a pixel by mixing amount of light from the different elements. For example, in some implementations, a pixel 302 can include a red LED 306A, a blue LED 306B and two green LEDs 306C. Electrical control signals and electrical power can be supplied to the light emitting elements 306A, 306B, 306C, 316A, 316B, 316C by electrically conductive signal lines 304, 314. The light emitting elements 306A, 306B, 306C, 316A, 316B, 316C and the signal lines 304, 314 can be opaque and/or can have an index of refraction that is not equal to 1, such that light is blocked by or diffracted by the elements and/or the signal lines and is propagates into or through the display. Thus, because the reduced-resolution portion of the of the emissive display shown in FIG. 3B has a lower density per unit area of light emitting elements than the high-resolution portion of the emissive display shown in FIG. 3A, the reduced-resolution portion may allow more light to pass through the display than the high-resolution portion of the display. However, the light passing through the display may still experience signal lines 242 running in a vertical (y) direction and/or in a horizontal (x) direction.

Figure 4:
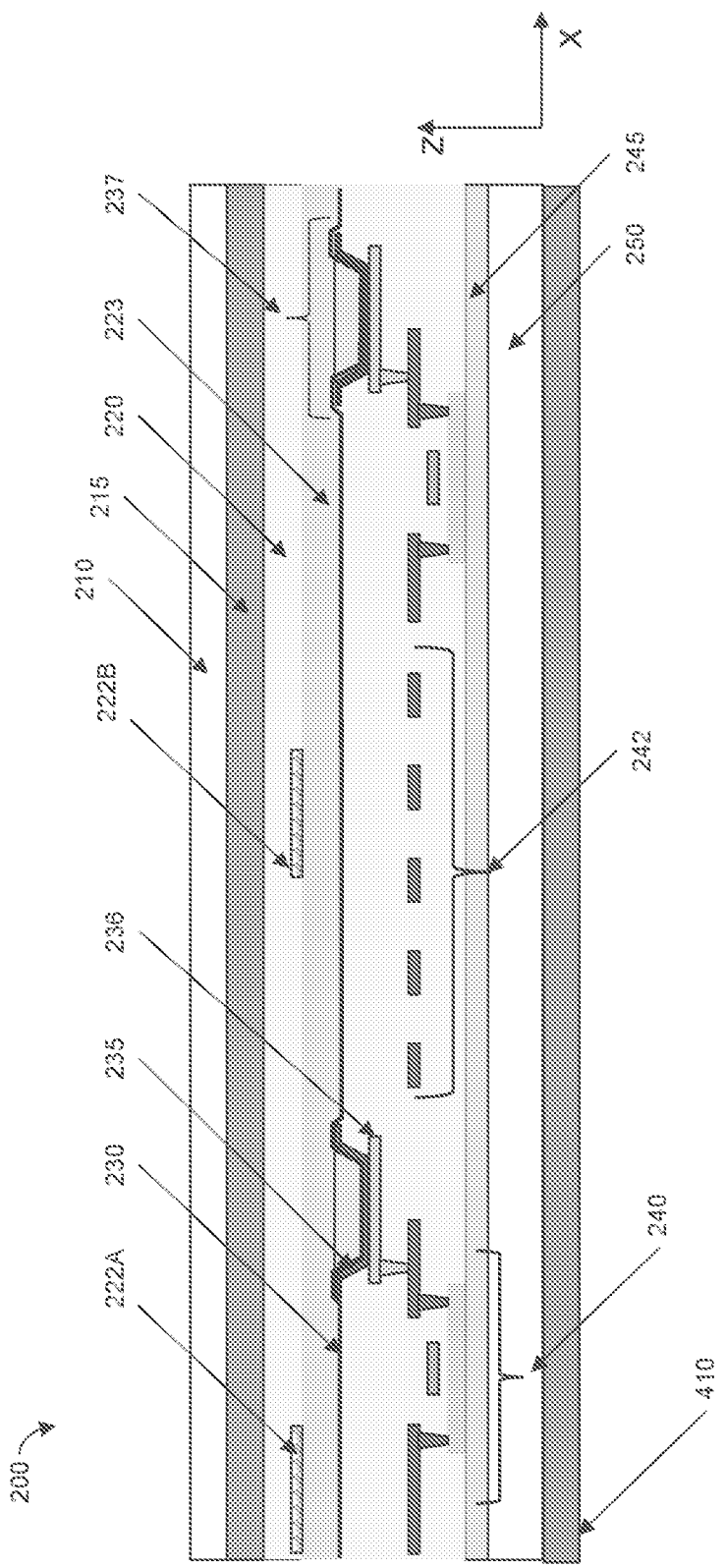
FIG. 4 depicts a possible side, cross-sectional view of the emissive display shown in FIG. 3B.

FIG. 4 illustrates a schematic side, cross-sectional view of an emissive display 200 suitable for use with the mobile device of FIG. 1. In some implementations the display 200 can be an AMOLED display. While the principles of the disclosure may be applied to various other display technologies, the implementation of an AMOLED display will be considered throughout the disclosure.

As shown in FIG. 4, the emissive display 200 includes a plurality of layers. The layers are positioned behind (i.e., below) a cover glass layer 210 that can form the front surface of the mobile device 100. In a possible implementation, the display 200 can include a polarizer film layer 215. The display 200 can also include a touch sensor layer 220 that includes touch sensor electrodes 222. Pixels 237 for the display are formed from a cathode layer 230, an OLED emitter stack 235, and separate elements of an anode layer 236. Elements of the anode layer 236 may be reflective so that light is directed in a vertical (z) direction from the anode layer 236. An element of the anode layer 236 can be coupled to a thin film transistor (TFT) structure 240 that includes a source, a gate, and a drain, which can be controlled by electrical signals transmitted over signal lines 242. The display 200 can further include a barrier layer 245 of SiNx or SiONx and a substrate layer 250 of polyimide (PI). A metallic layer/film 410 for heat spreading and electrical shielding can be located below the display 200 to protect the display from localized hot spots due to heat-generating elements in the mobile device, such as, for example, a CPU, a GPU, etc., as well as from electrical signal noises from the underneath electrical components.

The layers of the display 200 may include transparent and non-transparent circuit elements. For example, the TFT structure 240, the pixels 237, the signal lines 242, and/or touch sensor electrodes 222 all may block light from propagating through the display 200. Light can be either reflected or absorbed by the non-transparent (i.e., opaque) circuit elements. Additionally, the circuit elements may define gaps (i.e., periodic slits) with which the light may interact. For example, light may be diffracted by gaps formed between adjacent circuit elements in the same layer. Light may also be diffracted by gaps between circuit elements in different layers, although the effect may be weaker than the diffraction due to elements of the same layer.

Figure 5:
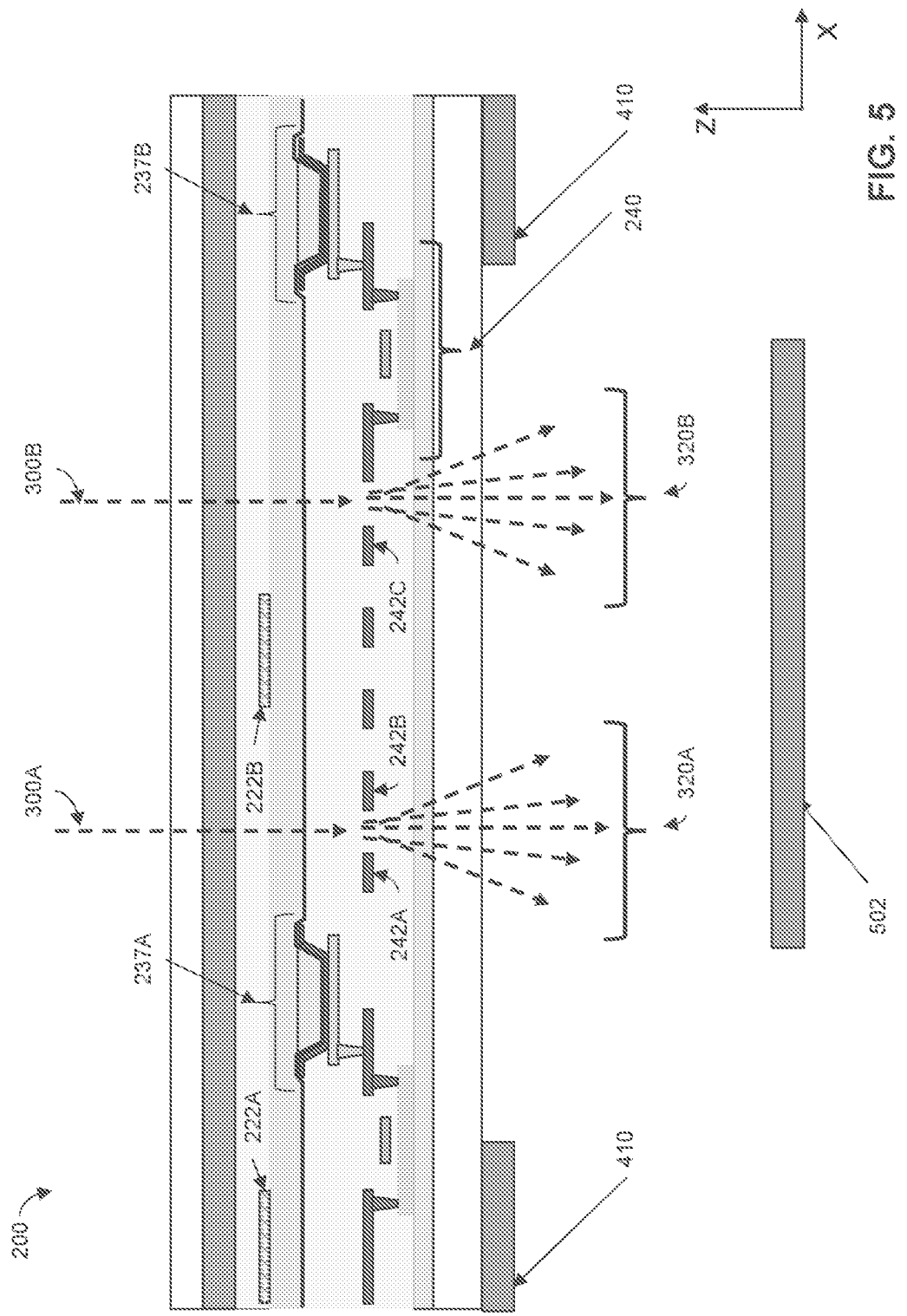
FIG. 5 depicts the possible effects on light passing through the emissive display of FIG. 4.

FIG. 5 is a schematic side, cross-sectional view of a portion of a display 200 with light diffracted by circuit elements in the display. As shown, a light ray 300A may pass between touch sensor electrodes 222A, 222B and between pixels 237A, 237B without being altered significantly. However, the light 300A can be diffracted by a gap formed between two adjacent signal lines 242A, 242B that are placed close to each other. The dimension of a gap relative to the wavelength of the light ray 300 can determine the effect the gap has on the light. Accordingly, light may diffracted by gaps formed by other combinations of circuit elements provided the gaps formed are of suitable dimensions. For example, light 300B can be diffracted differently from by a gap formed between a signal line 242C and a TFT structure 240 than the light 300A that is diffracted by a gap between adjacent signal lines. A camera 502 positioned behind (i.e., below) the display 200 can image light, and an opening in the metallic layer/film 410 can allow light transmitted through the display to reach the camera.

When light is considered as a collection of rays, diffraction may be understood as effectively changing angles of some of the rays in the collection of rays so that the diffracted rays 320A, 320B are distributed over a diffraction angle. In general, narrower gaps in the display result in larger diffraction angles. Accordingly, higher resolution displays may have more pronounced diffraction (i.e., larger diffraction angles) because the density of the control lines 242 in these displays is higher.

The camera 502 relies on a lens to focus a light from an object onto a sensor (e.g., a CMOS, CCD array), with the sensor surface being located as the focal plane of the lens. However, when the light rays that pass through the display to the lens are diffracted by opaque elements in the display, many rays will not be focused onto the surface of the sensor but rather will have an effective focal plane above or below the sensor surface. As a result, an image captured from light that passes through a display can be distorted by diffraction.

Figure 6B:
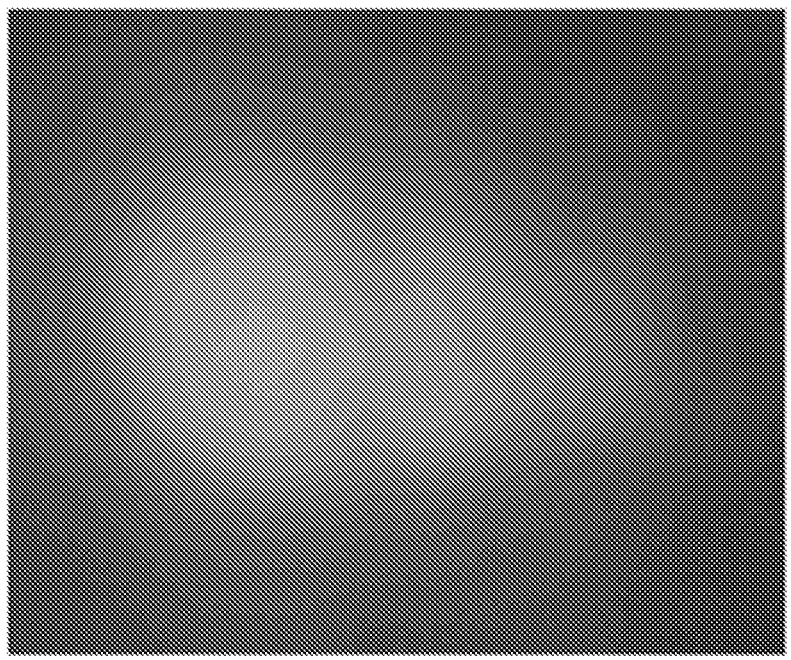
FIG. 6B depicts an example of an image captured from light with diffraction.
Figure 6A:
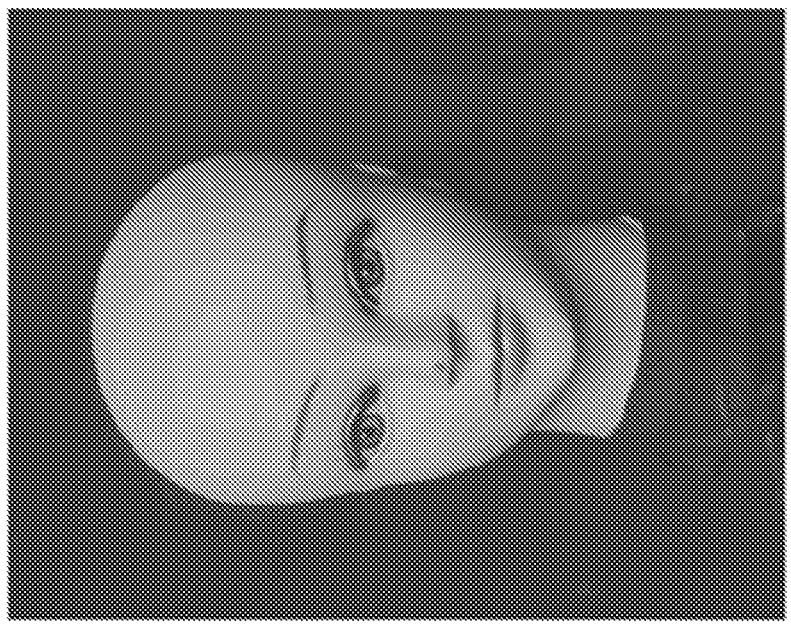
FIG. 6A depicts an example of an image captured from light without diffraction.

FIG. 6A depicts a simulated image of an object (i.e., a 3D model head) captured without diffraction, and FIG. 6B depicts a simulated image of a head captured with diffraction (i.e., through the display). As shown, the image formed with light including diffracted light is severely degraded and appears hazy because of the diffracted light rays. An aspect of the present disclosure is reducing diffraction caused by a display panel structure to improve the quality of images captured through the display (i.e., reduce a haze in the images).

The present disclosure describes a display having a through-transmissive region 120 that, when positioned over (i.e., in front of) a camera, facilitates imaging by decreasing the amount of light that causes image distortion from reaching the camera 140. This may be partially accomplished by reducing a number of pixels in the through-transmissive region (see FIG. 3B) (i.e., compared to other areas of the display) to allow more light to pass through the display. The pixels in the through-transmissive area may be regularly arranged (e.g., in a grid pattern) or may be non-regularly arranged. The number of pixels per unit area in the through-transmissive area may be smaller than that of the rest of display screen (e.g., the high-resolution area). In other words, a portion of pixels in the through-transmissive area can eliminated so that the remaining pixels are spaced further apart than the pixels of other parts of the display. This approach alone may still permit light to diffract from gaps formed between circuit elements (e.g., signal lines 242). Accordingly, the present disclosure describes additional modifications of the through-transmissive region (as compared to other regions) to increase throughput of light and decreased diffraction of the light.

Figure 7A:
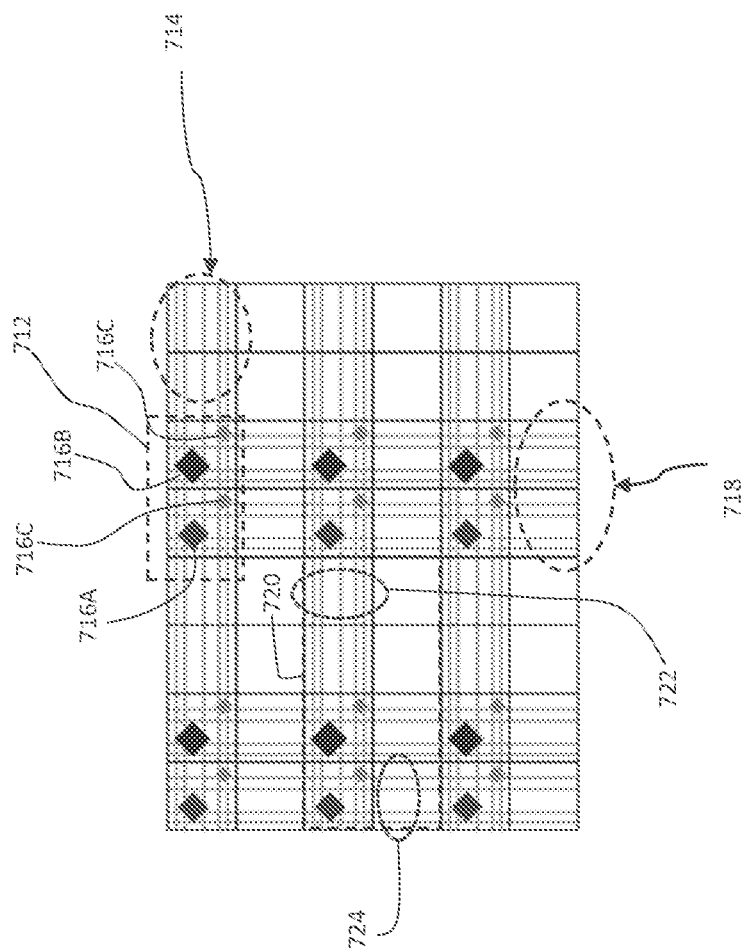
FIG. 7A is a schematic diagram of a reduced resolution portion of a display.
Figure 7B:
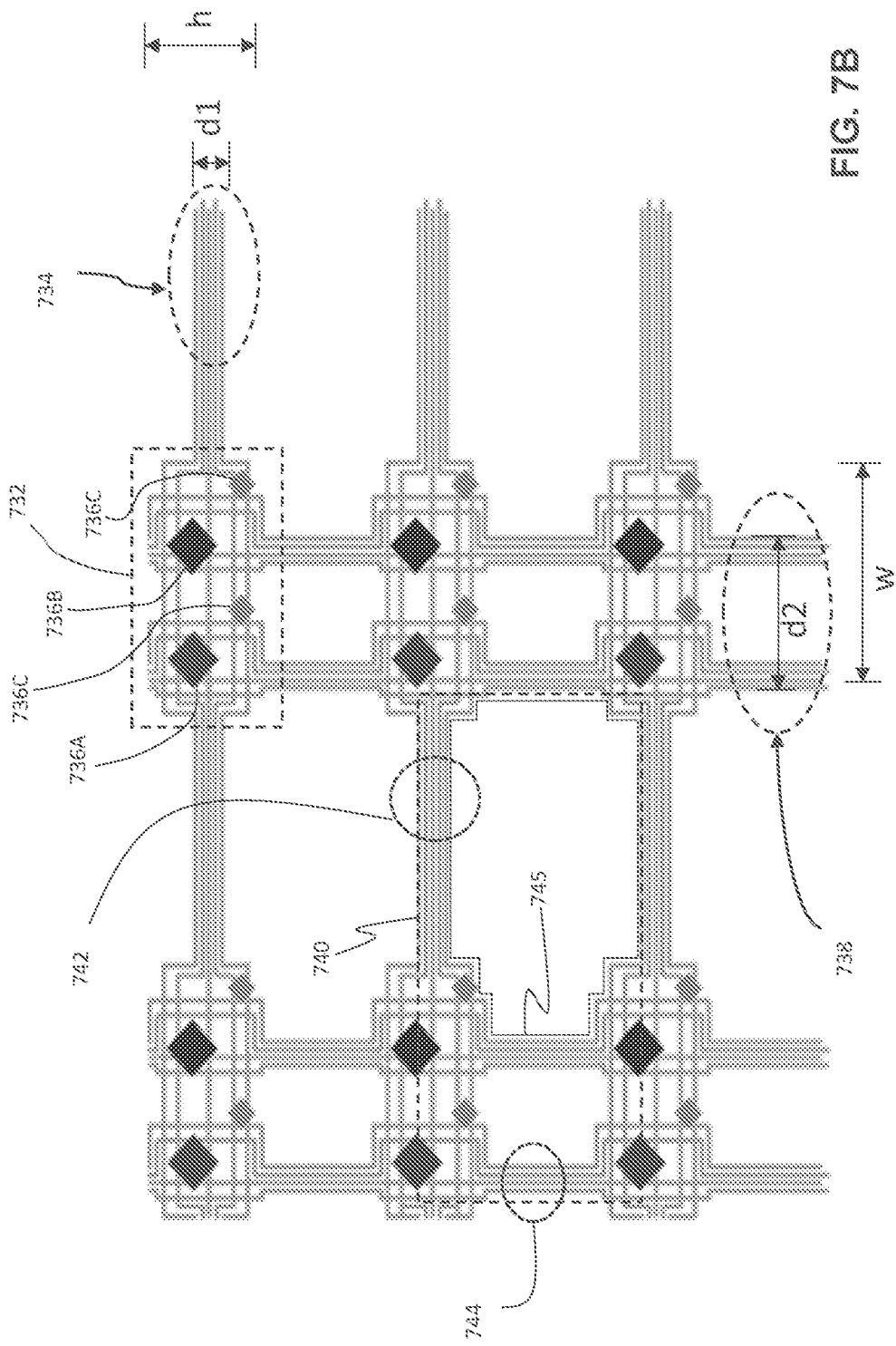

An additional modification includes a routing of signal lines between the pixels in a through-transmissive area of a display 120 in a manner designed to provide one or more relatively large areas with no, or relatively few, opaque and/or diffractive elements. FIGS. 7A and 7B depict example arrangements of pixels 712, 732 and signal lines 714, 718, 734, 738 of a through-transmissive area of a display. Each pixel in the through-transmissive area can include a plurality of sub-pixels, for example, a red sub-pixel 716A, 736A, green sub-pixels 716C, 736C, and a blue sub-pixel 716B, 736B, where the sub-pixels correspond to individual OLED emitters that can emit light of different colors. For example, a pixel 712, 732 of the display that can emit light of any color can include three or more sub-pixels that emit light having at least three different colors, and the intensity of the different colors can be controlled, so that when mixed, the light from the multiple sub-pixels can produce light having any color. The sub-pixels 716A, 716B, 716C, 736A, 736B, 736C are addressed with signal lines 714, 718, 734, 738 that carry electrical signals to the sub-pixels to control their illumination. The pixels and their constituent sub-pixels are arranged in a repeating pattern in the display, and the pattern can be characterized by a unit cell 720, 740, which is a smallest geometric arrangement of the group of elements (i.e., pixels, their subpixels, and the signal lines that supply signal lines to the sub-pixels) that constitutes this repeating pattern of the structure. It is noted that FIGS. 7A and 7B are top views of the structure, and that the unit cells 720, 740 are two-dimensional unit cells of elements that may not necessarily all lie in the same plane that is normal to a third dimension not represented in FIG. 7A or FIG. 7B.

FIG. 7A is a schematic diagram of a reduced resolution portion of a display with signal lines in a conventional arrangement, while FIG. 7B is a schematic diagram of a reduced resolution portion of a display in which groups of signal lines that are rearranged to create relatively large openings 745 between the signal lines, where the openings 745 are free of sub-pixels and signal lines. The openings 745 provide substantially clear apertures through which light can pass to reach an optical device (or devices) positioned behind the display. In other words, the openings 745 are free of pixels or signal lines that could block or diffract light. The openings 745 may be contiguous areas within the unit area that are free from sub-pixels and signal lines. The unit cell may be referred to as a first area. The aperture may be referred to as a second area, and may be contained within the first area.

As shown in FIG. 7B, there are portions 742, 744 of a unit cell 740 between adjacent pixels 732 in which adjacent parallel signal lines 734, 738 are closer together than signal lines 714, 718 in counterpart portions 722, 724 shown in FIG. 7A. In particular, in FIG. 7A, a group of parallel signal lines 714, 718 that supply control signals to subpixels of a pixel span a distance transverse to the signal lines that is comparable to the transverse extent of the subpixels of a pixel. However, in some implementations, as shown in FIG. 7B, a group of parallel signal lines 734 that supply control signals to subpixels 736A, 736B, 736C of a pixel 732 span a distance, d1, transverse to the signal lines 734 that is less than the transverse extent, h, in a first direction of the subpixels of the pixel. For example, d1 can be less than 0.8*h, or less than 0.6*h, or less than 0.5*h, or less than 0.4*h. Similarly, a group of signal lines 738 that are parallel to each other but that are not parallel to signal lines of group 734 and that supply control signals to the subpixels 736A, 736B, 736C of the pixel 732 span a distance, d2, transverse to the signal lines 738 that is less than the transverse extent, w, in a second direction of the subpixels of the pixel. For example, d2 can be less an 0.8*h, or less than 0.6*h, or less than 0.5*h, or less than 0.4*h.

In some implementations, as shown in FIG. 7B, the signal lines in the display can be arranged such that a unit cell 740 of the repeating pattern includes an open aperture 745 that is free of subpixels and signal lines, where the aperture 745 has an area that is greater than 40%, or greater than 60%, of the area of the unit cell 740.

In some implementations, in one or more of the portions 742, 744, in a group of three or more parallel signal lines, the signals lines can be spaced apart from neighboring signal lines with a pitch (i.e., the distance the central axis of one signal line in the group to a central axis of a neighboring signal line) of less than 7 microns, or less than 6 microns, or less than 5 microns.

In some implementations, in one or more of the portions 742, 744, in a group of two or more parallel signal lines, the signals lines can be spaced apart from neighboring signal lines with a gap (i.e., the separation between an edge of one signal line in the group to an nearest edge of a neighboring signal line) or of less than one micron. The signals lines may have a width in a direction perpendicular to their central axis of greater than 500 nm.

As mentioned, the circuit elements may form gaps (i.e., slits) that can diffract the light, and constraining the circuit elements (e.g., control signal lines) into bundled smaller regions (e.g., to create openings in the through-transmissive region) can enhance the diffraction, because the gaps are made smaller compared to a wavelength of light. However, to prevent diffracted light from reaching the camera, light directed to circuit elements of the display that would cause deleterious diffraction can be blocked before reaching the circuit elements or after being diffracted by the circuit elements but before reaching the camera (i.e., after passing through the circuit elements). Accordingly, an aspect of the disclosed display includes a light-blocking layer that has an opaque pattern aligned with the circuit elements in the through-transmissive area to block light before or after propagating through light-diffracting gaps formed by the circuit elements.

Figure 8:
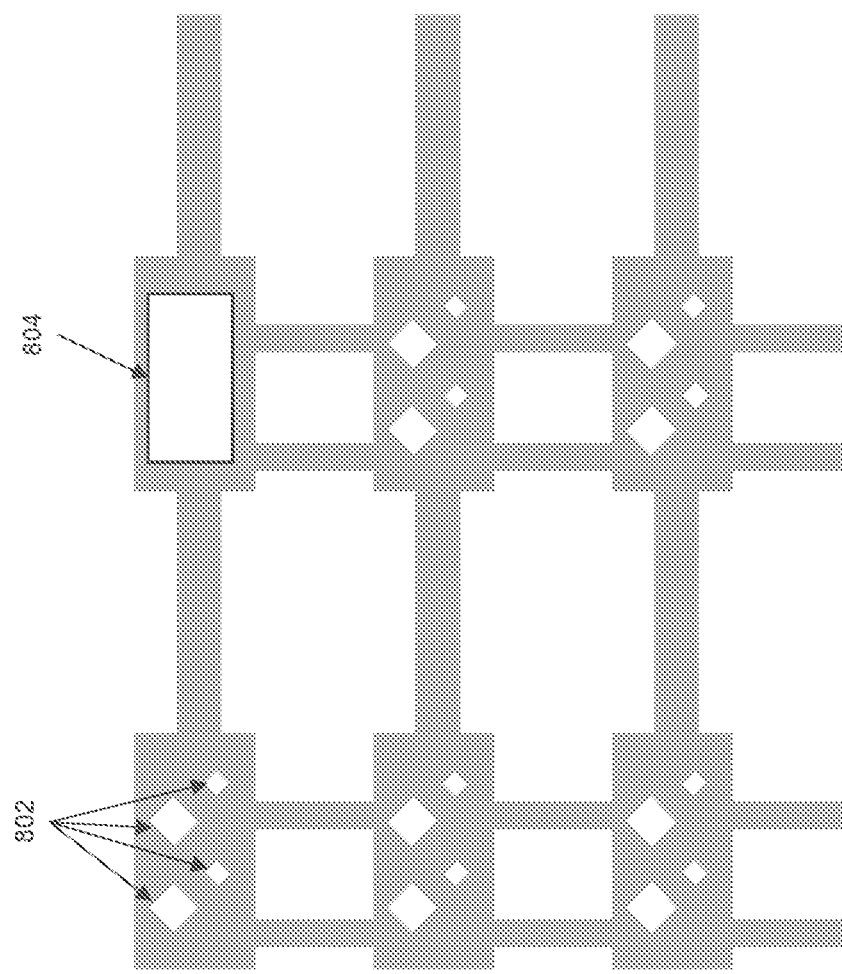

FIG. 8 is a top view of an opaque pattern used in through-transmissive areas and configured to block light from passing through gaps between opaque elements in the display, to avoid diffraction of light by the gaps. The opaque pattern corresponds to a pattern of circuit elements (e.g., signal lines) of the portion of the display portion shown in FIG. 7 and is shaped and aligned accordingly. The opaque pattern may be made from a material (or materials) that have reflective or absorptive properties to all (or a portion) of the wavelengths of the light captured by the camera. The opaque pattern may be any thickness (e.g., the thickness of a deposited metal trace), but thin layers can offer additional flexibility and may reduce the effect of unwanted shadows. In implementations in which the light-blocking layer is positioned above the pixels of the through-transmissive region, the opaque layer may include apertures 802 that are aligned with pixels (i.e., sub-pixels) in the through-transmissive region to allow light emitted from the pixels to transmit light through the apertures and out of the surface of the device. Alternatively (or additionally) the opaque pattern may include a single aperture 804 that allows all sub-pixels to transmit light through the aperture an out of the surface of the device.

Figure 9A:
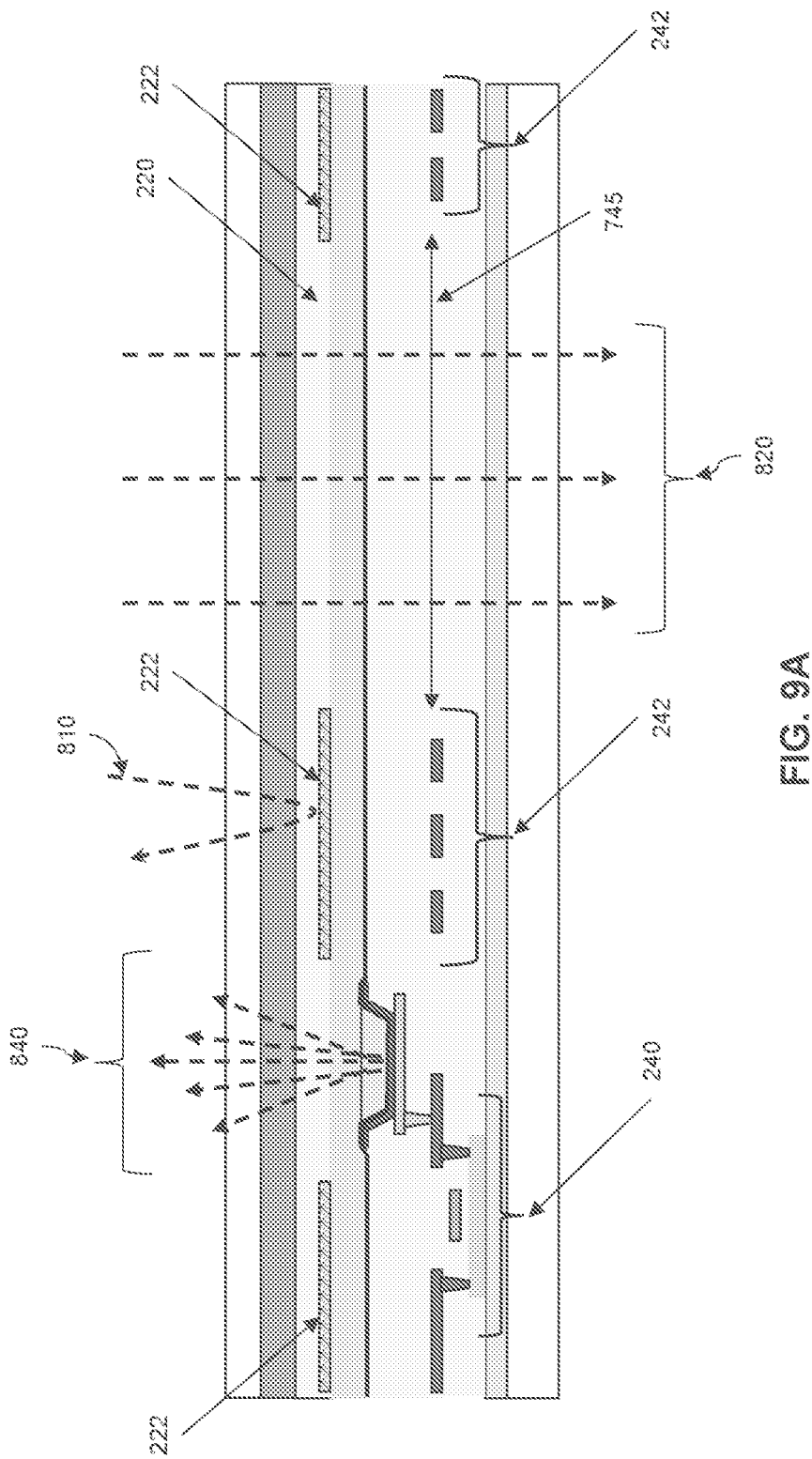
FIG. 9A depicts a side, cross-sectional view of a reduced-resolution portion of an emissive display including an opaque layer above rearranged signal lines according to a possible implementation of the disclosure.

FIG. 9A depicts a side, cross-sectional view of a reduced-resolution portion of an emissive display including an opaque layer above rearranged signal lines according to a possible implementation of the disclosure. Compared with FIG. 4, the implementation in FIG. 9A has fewer pixels, and the signals lines 242 are arranged to form openings 745 that do not include circuit elements, which light 820 can pass through without interacting with (e.g., being diffracted by) circuit elements. The lateral dimensions of an opening 745 can be greater than three times the longest wavelength of light that passes through the opening and that is imaged by a camera located below the display 200. By lateral dimensions, it is intended to refer to dimensions in directions parallel to the plane in which the display extends. The circuit elements can include control signal lines 242 and/or the TFT structure 240. The circuit elements are blocked (i.e., shaded) from receiving and diffracting light 810 by touch sensor electrodes 222. In other words, the touch sensor can be used as the light-blocking layer. This approach, rather than adding an additional light-blocking layer, may advantageously integrate with an existing fabrication processes. The pixel emission light 840 is unaffected by the opaque pattern formed by the touch sensor electrodes 222, because the touch sensor electrodes 222 are aligned with respect to the pixels, such that light from the pixels can be emitted from the display without inhibition from the touch sensor electrodes 222.

A touch sensor in the through-transmissive area of the display may be active or inactive. For example, the electrodes in the touch sensor layer 220 can include dummy sensor lines that do not contribute to sensing or active sensor lines used to detect a touch. Either the dummy or active sensor lines (or both) may be used to form an opaque pattern to block light from reaching the gaps created by the signal lines 242. That is, in addition to the active electrodes and sensor lines, the touch sensor layer 220 may be designed to include additional dummy sensor lines that, along with the active sensor lines, form an opaque pattern to block light from reaching the gaps created by the signal lines 242. Thus, an aspect of the disclosed display includes utilizing the touch sensor layer as a light-blocking layer by forming the electrode 222 for touch sensing into an opaque pattern to block (e.g., absorb, reflect) light 810 (e.g., visible and infrared light) that could otherwise be diffracted and degrade an image captured by a sensor located below the light blocking layer. The display implementation of FIG. 9A may advantageously have fewer layers because the touch sensor layer serves a dual purpose.

Figure 9B:
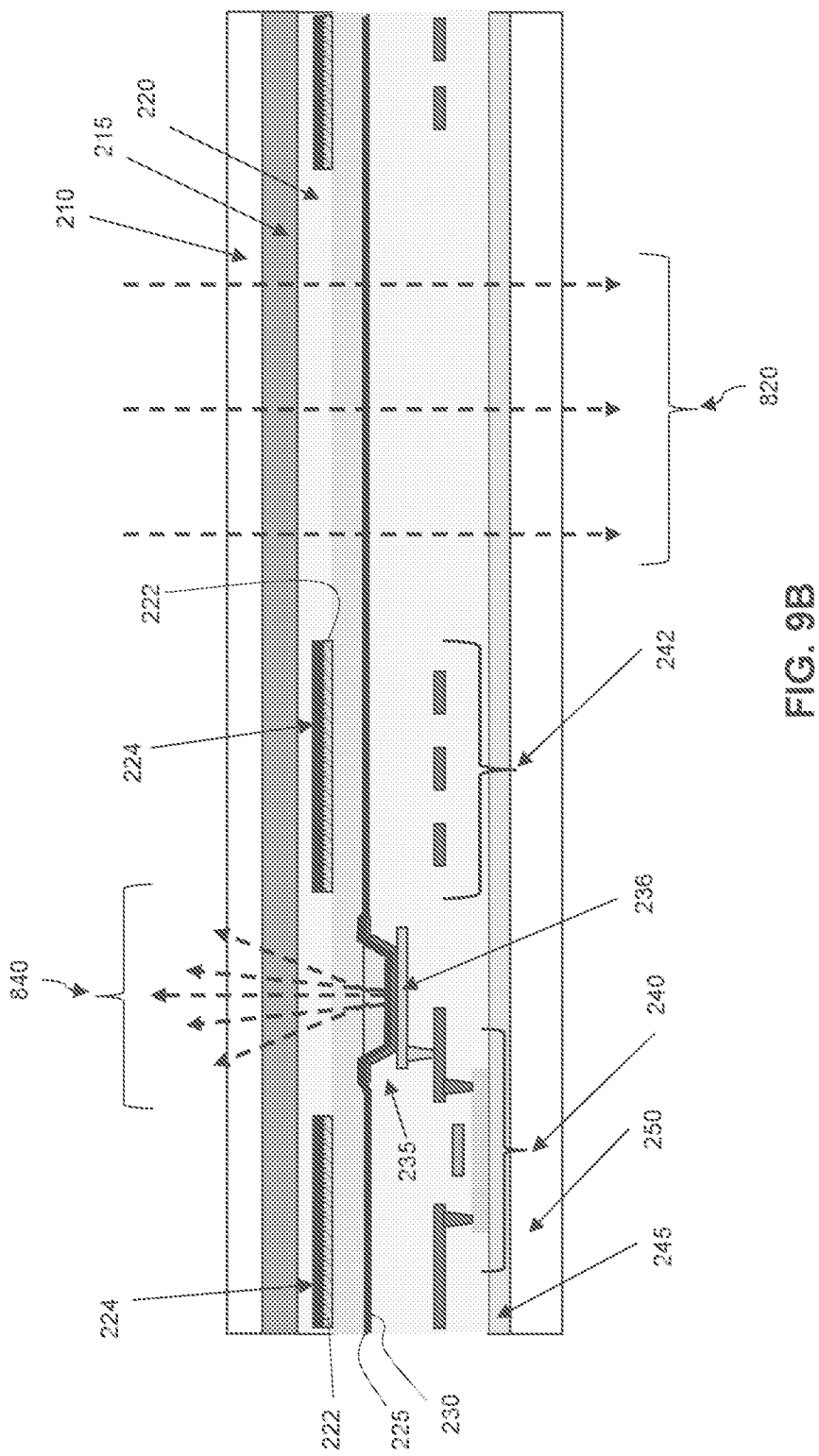
FIG. 9B depicts another side, cross-sectional view of a reduced-resolution portion of an emissive display including an opaque layer above rearranged signal lines according to a possible implementation of the disclosure.

FIG. 9B depicts another side, cross-sectional view of the reduced-resolution portion of an emissive display. The touch sensor electrodes 222 are part of the touch sensor layer 220, and the touch sensor electrodes 222 can include an opaque metal material (e.g., Al, Ti, Mo, Cu, Cr, Ag, Au, etc. or alloys thereof). In some implementations, the thickness of the touch sensor electrodes 222 can be about 20-200 nm. The touch sensor layer 220 can be separated from the top cathode layer 230 of the OLED emitters 235 by a sensor buffer layer 225. The sensor buffer layer can include, for example, SiN or SiON material.

Because the touch sensor electrodes 222 include metal material, the reflectivity of the metal material may be relatively high. To reduce the reflectivity of the touch sensor electrodes 222, the electrodes may be covered with a layer of low reflectivity material. For example, in some implementations, the metal touch sensor electrodes 222 can be covered by an additional optically absorbing material 224 that covers the surface of touch sensor electrodes 222. In some embodiments, the optically absorbing material 224 can extend around the edges of the electrodes to cover the edges of the metal touch sensor electrodes 222. For example, the optically absorbing material 224 can include a black photoresist material, which can be similar in composition to materials used for LCD color filter fabrication and which is typically modified for low temperature curing necessary for compatibility with OLEDs (e.g. 100-120° C.). These materials have high optical absorption for optical wavelengths of light (e.g. >90% for 1 μm thickness layer of photoresist) and can help decrease the amount of light scattered by metal touch sensor electrodes 222 towards the imaging device behind the display panel. In some implementations, the total combined thickness of the touch sensor electrodes 222 covered by an optically absorbing material 224 can be about 200-500 nm.

FIGS. 9C, 9D, 9E, and 9F depict side, cross-sectional views of a metal touch sensor electrode 222 in various stages of being covered by an opaque, low-reflectivity material. FIG. 9C depicts a side cross-sectional view of a metal touch sensitive electrode layer 222 on a supporting substrate layer 223. FIG. 9D depicts a side cross-sectional view of a metal touch sensitive electrode layer 222 on a supporting substrate layer 223, with a photoresist layer 224 above the metal layer 222. The photoresist layer 224 can be patterned with conventional photolithography techniques (e.g., coating the underlying metal layer 222 with a photoresist layer spanning the substrate layer 223, exposing the photoresist layer to a pattern of light, developing the exposed photoresist layer, baking the layer) to create the pattern of photoresist depicted in FIG. 9D. The photoresist layer typically can be about 1-3 μm thick. A metal etching process can be applied to the stack shown in FIG. 9D to remove material from the metal layer 222 that is not directly under the patterned photoresist layer 224. FIG. 9E depicts a side cross-sectional view of the metal touch sensitive electrode layer 222 on the supporting substrate layer 223, with a photoresist layer 224 above the metal layer 222, after metal etching has been applied to remove metal from layer 222, except under patterned resist 224. The metal layer can be overetched, so that the photoresist layer 224 extends outward, parallel to the substrate layer beyond the edges of the remaining metal electrode layer 222. In some implementations, the structure shown in FIG. 9E can be further processed, so that the photoresist layer 224, covers the edges of the metal layer 222. For example, the structure shown in FIG. 9E can be heated, so that the photoresist 224 flows down over the edges of the metal layer 222 to form the structure shown in FIG. 9F.

Figure 10A:
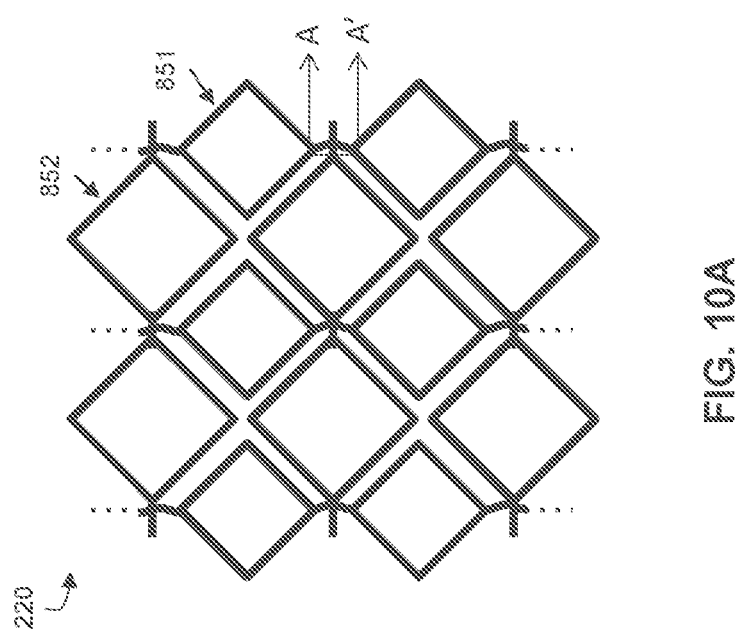
FIG. 10A depicts a top view of electrodes in touch sensor layers that can be used for the opaque layer in possible implementations of the present disclosure.
Figure 10B:
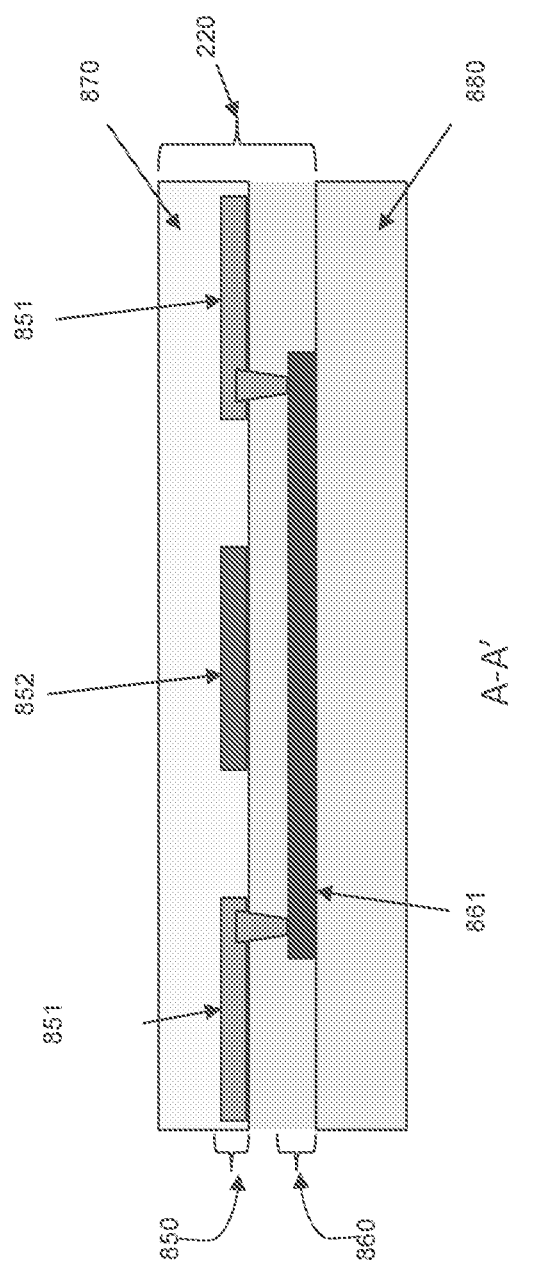
FIG. 10B depicts a side, cross-sectional view of a portion (A-A') of the touch sensor layers of FIG. 10A.

A touch sensor layer 220 for an emissive display may itself include multiple layers. FIG. 10A depicts a top view of electrodes in the touch sensor layer 220. The electrodes include a transmit (TX) sensor electrode 851 and a receive (RX) sensor electrode 852. FIG. 10B depicts a side, cross-sectional view of a portion (shown as A-A') of the touch sensor layers of FIG. 10A. As shown, the TX sensor electrode 851 and the RX sensor electrode 852 are coplanar and occupy a first metal layer 850. The TX and RX electrodes form overlapping patterns. Accordingly, a second metal layer 860 is used for a jumper (i.e., bridge) electrode 861 to allow the overlapping electrical connections. The touch sensor layer 220 may further include a sensor passivation layer 870 and a sensor buffer layer 880. The opaque pattern of the touch sensor electrode for blocking light may include either, or both, the first metal layer 850 and the second metal layer 860 of the touch sensor layer 220. In this regard, the electrodes 222 shown in FIG. 9A may be generally regarded as being a part of a first metal layer 850 or as part of a second metal layer 860 of the touch sensor layer 220.

Figure 11:
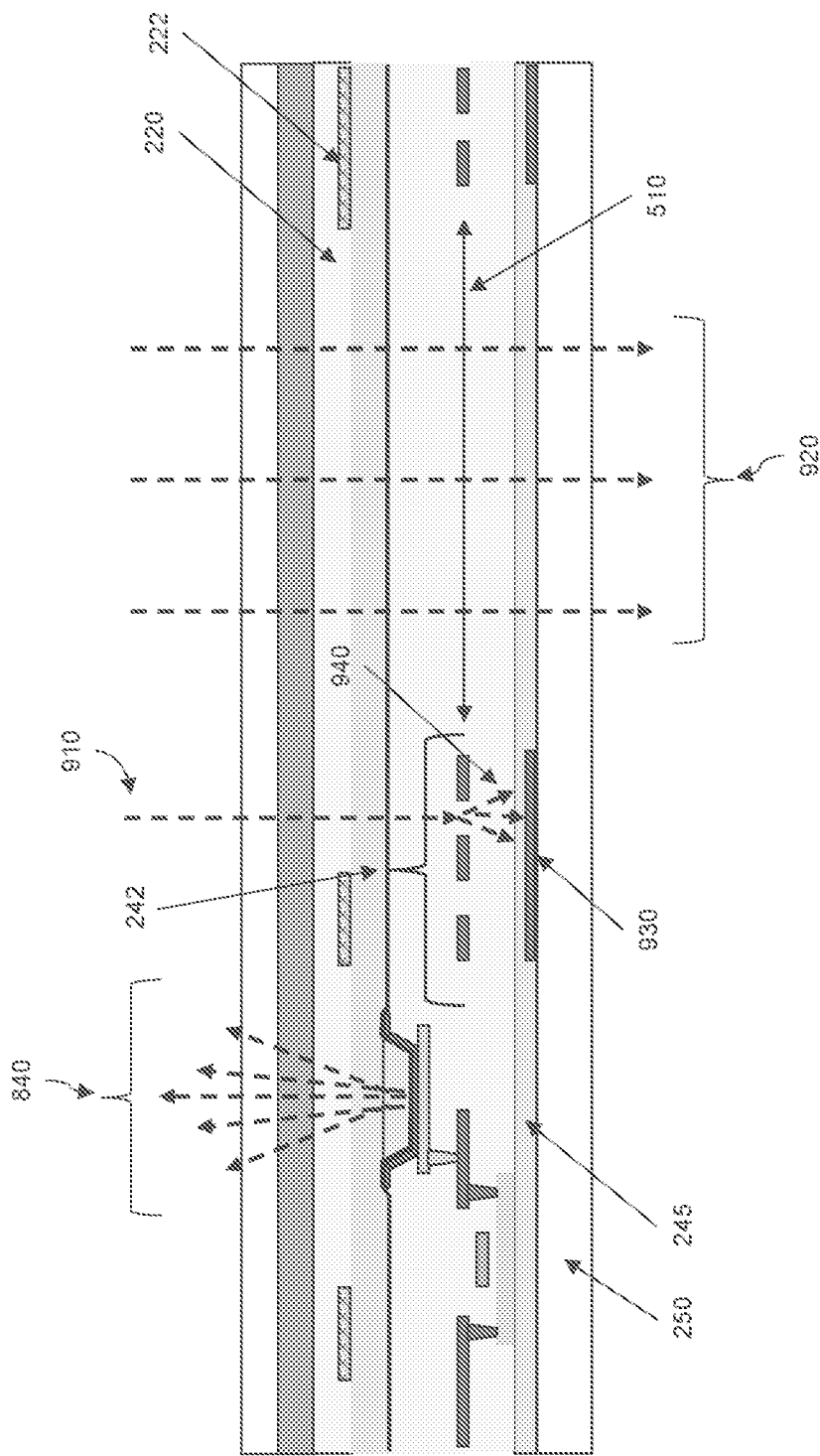
FIG. 11 depicts a side, cross-sectional view of a reduced-resolution portion of an emissive display including an opaque layer below rearranged signal lines according to a possible implementation of the disclosure.

In some possible implementations, light passing through the display may be blocked from reaching the camera under the display after being diffracted from circuit elements in the display. FIG. 11 depicts a side, cross-sectional view of a reduced-resolution portion of an emissive display including an opaque layer below signal lines according to a possible implementation of the disclosure. The display can include an opaque pattern 930 on the substrate (e.g., polyimide layer) 250 for blocking light. The opaque pattern 930 on the substrate 250 can include, for example, metal, photoresist, polymer, and other opaque materials. The opaque pattern 930 is positioned below and aligned with the circuit elements (e.g., signal lines 242) that can cause deleterious diffraction of light 910 passing through gaps between the elements, resulting in diffracted light 940. The diffracted light 940 can be blocked by the opaque pattern 930 on the substrate layer 250.

With the opaque pattern 930 of the light blocking layer being below the OLEDs of the pixels, apertures in the opaque layer for transmitted light 840 from pixels to shine through are unnecessary. Accordingly, the precision of alignment of the opaque mask with respect to the OLEDs may be relaxed somewhat compared to implementations requiring apertures for the OLEDs. As shown in FIG. 11, the spacing between the opaque pattern 930 and the circuit elements (e.g., signal lines 242) is made small enough that diffracted light 940 is blocked before it can reach an opening 510.

Variations to the implementations described may exist. For example, in other implementations, layers may be added to the display with the sole purpose of blocking light. Further, layers other than the layers described thus far may be adapted to serve a dual purpose that includes blocking light. A light-blocking layer need not be integrated (e.g., laminated) with the display (i.e., as described thus far) as long as the function of blocking diffracted light from reaching a light sensor (e.g., camera) is accomplished.

Figure 12:
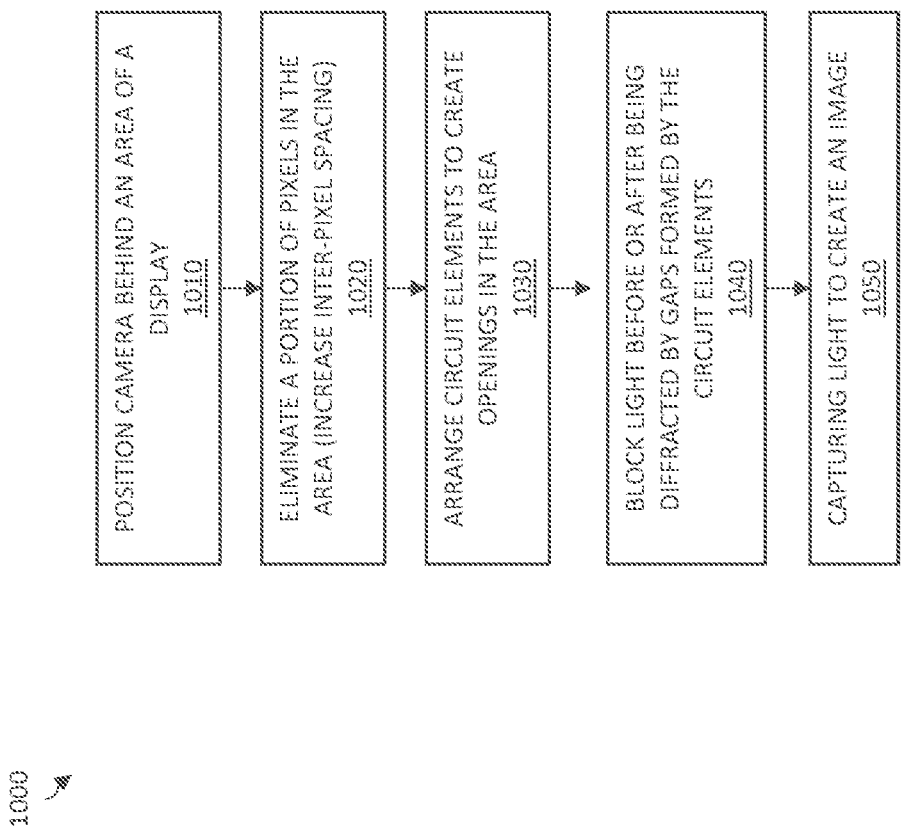
FIG. 12 depicts a flowchart of a method for imaging through a display according to an implementation of the present disclosure.

FIG. 12 is a flowchart of a method for imaging through a display according to an implementation of the present disclosure. The method 1000 begins with positioning 1010 a camera behind an area (i.e., a through-transmissive area). A portion of the pixels in the area are eliminated 1020 to increase the inter-pixel spacing. The increased inter-pixel spacing allows the display to remain active (e.g., in a display mode) while blocking less of the area for receiving light directed to the area (i.e., incident) light (e.g., in an imaging mode). The circuit elements in the area are then arranged 1030 to define openings in the area for light to easily pass through without encountering (e.g., being blocked, diffracted, reflected, or otherwise redirected by) pixels or circuit elements. The circuit elements may be control signal lines for the pixels in the TFT layer of the display. The control signal lines can be arranged by forming closely spaced groups that are aligned between pixels. As a result of the openings, a first portion of the light directed to the area of the display can pass through the display without encountering any of the circuit elements. A second portion of the light directed to the display can be diffracted by gaps formed by the circuit elements. Unless this second portion is blocked or prevented from forming, the diffracted light could degrade an image captured by the camera. Accordingly, the method includes blocking 1040 the second portion of the light directed to the area of the display using a light-blocking layer before or after the second portion of light is diffracted through gaps formed by the circuit elements. Having blocked the second portion of light within the display, the only the first portion of light reaches the camera. As a result, the first portion of light is captured by the camera (i.e., by a lens of the camera) and an image is captured 1050 (e.g., formed on an array of light sensors and reconstructed digitally based on the response from each sensor).

Variations to the method described in FIG. 12 may exist. For example, while blocking diffracted light from reaching a camera to improve the quality of an image captured by the camera has been described, the disclosed principles and techniques may be applied to other applications. For example, the performance of a light sensor used for detecting ambient light may be improved by one or more steps (or variations thereof) of the disclosed method. Additionally, the disclosed principles and techniques may be applied to a light source rather than a light sensor. For example, the performance of an illuminator may be improved by one or more steps (or variations thereof) in the disclosed method. A light source (e.g. an illuminator) and a light sensor (e.g. a camera) are each examples of light devices.

It will also be appreciated that the steps described in FIG. 12 may be performed at different times, or in different orders. For example, steps 1010, 1020, 1030, 1040 may be performed during the design and/or manufacture process of a device, whereas the step 1050 may be performed at a later time by a user of the device. Moreover, the steps may be performed in a different order to that described. For example, steps 1020, 1030 and/or 1040 may be performed as part of a fabrication process, before a camera is physically positioned adjacent to the display during a assembly process. Steps 1010, 1020, 1030 and/or 1040 may be performed as part of a design process. For example, it may be that no pixels are physically eliminated in step 1020. Rather, the non-eliminated pixels are designed so as to have a greater inter-pixel spacing than in another region of the display. Similarly, step 1010 may refer to a camera (or other light sensor, or a light source) being positioned behind the display in a design process, rather than being physically positioned.

The disclosed displays have been presented in the context of a mobile device, such as a tablet or a smart phone. The principles and techniques disclosed, however, may be applied more generally to any display in which it is desirable to position a sensor behind the display. For example, a virtual agent home terminal, a television, or an automatic teller machine (ATM) are a non-limiting set of alternative applications that could utilize a camera positioned behind an active area of a display. Further, the motivation for placing a camera behind a display is not limited to an expansion of the display to the edges of a device. For example, it may be desirable to place the camera behind a display for aesthetic or stealth reasons.

In the specification and/or figures, typical embodiments have been disclosed. The present disclosure is not limited to such exemplary embodiments. The use of the term "and/or" includes any and all combinations of one or more of the associated listed items. Unless otherwise noted, specific terms have been used in a generic and descriptive sense and not for purposes of limitation. As used in this specification, spatial relative terms (e.g., in front of, behind, above, below, and so forth) are intended to encompass different orientations of the device in use or operation in addition to the orientation depicted in the figures. For example, a "front surface" of a mobile computing device may be a surface facing a user, in which case the phrase "in front of" implies closer to the user. Additionally, a "top surface" of a display may be the surface facing a user, in which case the phrase "below" implies deeper into an interior of the mobile computing device, and the phrase "above" implies closer to the surface of the display facing the user.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

The invention claimed is:

1. A mobile computing device comprising:
   a display having a high-resolution area and a through-transmissive area, the through-transmissive area including:
      pixels that are spaced in a repeating pattern according to a first pixel density that is lower than a second pixel density of the high-resolution area;
      signal lines configured to provide electrical signals to the pixels, the signal lines arranged such that they diffract visible light that passes through the through-transmissive area; and
      a light-blocking layer having an opaque pattern that is positioned below, and aligned with, the signal lines to block light after the light propagates through gaps formed between the signal lines; and
   a light sensor positioned behind the through-transmissive area, such that the signal lines and the light-blocking layer are between a surface of the display and the light sensor, wherein the opaque pattern of the light-blocking layer is aligned with the signal lines to block light transmitted through the through-transmissive region and diffracted by the signal lines from reaching the light sensor, and the light sensor is configured to receive light through the display that is not blocked by the light-blocking layer.

2. The mobile computing device according to claim 1, wherein the display includes an active matrix organic light emitting diode (AMOLED) display.

3. The mobile computing device according to claim 1, wherein, in a repeating pattern of pixels in the through-transmissive area, in a group of three or more parallel signal lines between adjacent pixels, adjacent signal lines are spaced apart from each other by less than 7 microns.

4. The mobile computing device according to claim 3, wherein:
   the high-resolution area includes signal lines that are configured to provide electrical signals to pixels in the high-resolution area; and
   adjacent and parallel signal lines in the low-resolution area are spaced apart from each other by a distance that is less than a distance by which adjacent and parallel signal lines in the high-resolution area are spaced apart.

5. The mobile computing device according to claim 1, wherein, in a repeating pattern of pixels in the through-transmissive area, in a group of three or more parallel signal lines between adjacent pixels, adjacent signal lines are spaced apart from each other by less than 5 microns.

6. The mobile computing device according to claim 1, wherein the repeating pattern of pixels in the through-transmissive area is characterized by a unit cell having a first area, and wherein the unit cell includes a second area that is within the first area, that is free of subpixels and free of signal lines, and that is greater than 40% of the first area.

7. The mobile computing device according to claim 1, wherein the opaque pattern absorbs visible and infrared light.

8. The mobile computing device according to claim 1, wherein the opaque pattern reflects visible and infrared light.

9. The mobile computing device according to claim 1, wherein the light sensor includes a camera.

10. The mobile computing according to claim 1, wherein the light-blocking layer includes a pattern of opaque portions and transparent portions.

11. The mobile computing device according to claim 1, wherein a width of the signal lines is greater than 500 nm.

12. The mobile computing device according to claim 1, wherein two or more of the signal lines are parallel to each other, with a gap between the parallel signal lines being less than one micron.

* * * * *